(12) United States Patent
He et al.

(10) Patent No.: US 7,768,044 B2
(45) Date of Patent: Aug. 3, 2010

(54) METAL CAPACITOR STACKED WITH A MOS CAPACITOR TO PROVIDE INCREASED CAPACITANCE DENSITY

(75) Inventors: Canzhong He, Emmaus, PA (US); John A. Schuler, Blaine, MN (US); John M. Sharpe, Allentown, PA (US); Hong-Ha Vuong, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 959 days.

(21) Appl. No.: 10/903,938

(22) Filed: Jul. 30, 2004

(65) Prior Publication Data

US 2006/0024905 A1    Feb. 2, 2006

(51) Int. Cl.
H01L 29/76    (2006.01)
H01L 29/94    (2006.01)
H01L 21/20    (2006.01)
H01L 21/336   (2006.01)
H01L 21/8234  (2006.01)

(52) U.S. Cl. ............... 257/288; 257/401; 257/296; 257/298; 438/396; 438/197

(58) Field of Classification Search ............ 438/396, 438/197; 257/296, 297, 306, 305, 308, 311, 257/300, 299, 312, 532, 307
See application file for complete search history.

(56) References Cited

U.S. PATENT DOCUMENTS

| 4,980,799 | A | * | 12/1990 | Tobita | 361/311 |
| 5,350,705 | A | * | 9/1994 | Brassington et al. | 257/295 |
| 5,903,031 | A | * | 5/1999 | Yamada et al. | 257/356 |
| 6,028,324 | A | * | 2/2000 | Su et al. | 257/48 |
| 6,285,050 | B1 | * | 9/2001 | Emma et al. | 257/296 |
| 6,297,524 | B1 | | 10/2001 | Vathulya et al. | |
| 6,383,858 | B1 | | 5/2002 | Gupta et al. | |
| 6,385,033 | B1 | * | 5/2002 | Javanifard et al. | 361/306.2 |
| 6,448,599 | B1 | * | 9/2002 | Wang | 257/300 |
| 6,465,868 | B1 | * | 10/2002 | Ehben et al. | 257/532 |
| 6,635,916 | B2 | | 10/2003 | Aton | |
| 6,667,203 | B2 | | 12/2003 | Lee et al. | |
| 7,179,737 | B2 | * | 2/2007 | Nishida et al. | 438/649 |
| 2003/0042499 | A1 | * | 3/2003 | Reiner | 257/173 |
| 2004/0067600 | A1 | * | 4/2004 | Chatterjee | 438/14 |

* cited by examiner

*Primary Examiner*—Chuong A. Luu
(74) *Attorney, Agent, or Firm*—Ryan, Mason & Lewis, LLP

(57) ABSTRACT

An on-chip capacitive device comprises a semiconductor substrate, a MOS capacitor formed on the semiconductor substrate, and a metal interconnect capacitor formed at least in part in a region above the MOS capacitor. The MOS capacitor and the metal interconnect capacitor are connected in parallel to form a single capacitive device. The capacitance densities of the MOS capacitor and the metal interconnect capacitor are, thereby, combined. Advantageously, significant capacitance density gains can be achieved without additional processing steps.

20 Claims, 5 Drawing Sheets

METAL CAPACITOR STACKED WITH A MOS CAPACITOR TO PROVIDE INCREASED CAPACITANCE DENSITY

FIELD OF THE INVENTION

This invention relates generally to integrated circuits, and more specifically to capacitive devices in integrated circuits.

BACKGROUND OF THE INVENTION

As analog circuits have been integrated with digital circuits on complementary-Metal-Oxide-Semiconductor (CMOS) integrated circuits, the capacitor has come to dominate analog circuit design. In many cases, capacitor devices consume a large part of an integrated circuit's total area. As a result, decreasing the size of capacitor devices will allow an integrated circuit to be smaller, and, thereby, allow the integrated circuit to be produced more cost effectively.

Integrated circuits typically contain one or more of three types of capacitors. The first type is a Metal-Oxide-Semiconductor (MOS) capacitor. In such a device, the near-surface region of a doped semiconductor substrate acts as one terminal of the capacitor. The gate conductor is used as the other terminal, and the gate oxide acts as the capacitor dielectric.

The second type of capacitor is formed using two or more metal interconnects. Typically, two metal lines are electrically biased to opposite polarities and are placed in close proximity to one another in order to form the terminals of the capacitor. A dielectric material such as silicon dioxide fills the region between the interconnects. The metal lines may be interdigitated to increase the effective capacitive area of the device. An example of an interdigitated metal interconnect capacitor can be found in U.S. Pat. No. 6,383,858 to Gupta et al., which is incorporated by reference.

Finally, the third type of capacitor comprises a Metal-Isolation-Metal (MIM) capacitor. In such a device, a regular metal interconnect feature acts as one terminal of the capacitor. A specially deposited thin dielectric and a specially deposited metal level act to create the dielectric and second terminal, respectively.

Each of the three types of capacitors has substantial limitations when used alone. Among the above-mentioned devices, the MOS capacitor provides the highest capacitance density, typically 4-13 $fF/\mu m^2$ in 0.13 $\mu m$ and 90 nm technologies, depending on the gate dielectric thickness. However, MOS capacitors do not make use of the space above the capacitor for creating additional capacitance. Typically, the space above the MOS capacitor is blocked off from levels of metallization.

Moreover, capacitors created by metal interconnects suffer from low capacitance and, as a result, by themselves are not an area-efficient way to create capacitive devices on integrated circuits. Typical capacitance density is approximately 1-2 $fF/\mu m^2$. Likewise, MIM capacitors have low capacitance density, approximately 1 $fF/\mu m^2$, and, as a result, are also not area efficient. Moreover, the forming of MIM capacitors requires at least two additional lithographic masks and their associated processing. Cost of implementation, therefore, may be very high.

For the foregoing reasons, a new capacitive device with a higher capacitance density and without additional implementation costs is highly desirable.

SUMMARY OF THE INVENTION

The present invention addresses the above-identified need by providing a novel design for effectively increasing capacitance density without increasing processing costs. The design achieves this by stacking vertically MOS capacitors with metal interconnect capacitors and providing interconnection in such a way as to combine capacitance densities.

In accordance with one aspect of the invention, an on-chip capacitive device comprises a semiconductor substrate, a MOS capacitor formed on the substrate, and a metal interconnect capacitor formed at least in part in a region above the MOS capacitor. The MOS capacitor and the metal interconnect capacitor are connected in parallel to form a single capacitive device. The capacitance densities of the MOS capacitor and the metal interconnect capacitor are, thereby, combined. Compared to the MOS capacitor alone, a design incorporating an illustrative embodiment of the present invention will increase the capacitance density by approximately 7-50%.

In an illustrative embodiment of the invention, the MOS capacitor comprises a first terminal formed in the semiconductor substrate near the surface of the semiconductor substrate, a dielectric formed on top of the substrate, and a second terminal formed on top of the dielectric. The second terminal substantially overlaps the first terminal. The metal interconnect capacitor, on the other hand, comprises five metal levels formed in the region above the MOS capacitor, each metal level containing two patterned metal features separated by a dielectric. A plurality of vertical contacts connects patterned metal features in one metal level to patterned metal features in other metal levels. To gain the ultimate capacitance density advantage, additional vertical contacts are used to connect the MOS capacitor and metal interconnect capacitor in parallel.

Advantageously, formation of the on-chip capacitive device in the illustrative embodiment does not require additional processing steps over the processing steps required to form the remainder of the integrated circuit.

These and other features and advantages of the present invention will become apparent from the following detailed description which is to be read in conjunction with the accompanying drawings.

DETAILED DESCRIPTION OF THE INVENTION

The vertical direction is defined herein as that direction normal to the surface of the substrate.

The horizontal direction is defined herein as that direction parallel to the surface of the substrate.

The term "level" is defined herein as a plane parallel to the surface of the substrate containing one or more patterned features.

The term "capacitance density" is defined herein as capacitance per unit area of the integrated circuit.

The present invention will be illustrated below in conjunction with an illustrative embodiment of an on-chip capacitive device. It should be understood, however, that the invention is not limited to the particular circuitry arrangements of the illustrative embodiment. For example, those skilled in the art will recognize that the conductivity types of the devices in a given circuit design may be reversed, e.g., n-type devices may be replaced by p-type devices. These and other modifications to the illustrative embodiment will be apparent to those skilled in the art.

FIGS. 1A-1E combine to show an on-chip capacitive device comprising aspects of the present invention. The on-chip device comprises two sub-elements: a MOS capacitor and a metal interconnect capacitor. A plurality of vertical contacts is used to connect the respective sub-elements in such a way as to combine their respective capacitance densities.

Figure 1A:
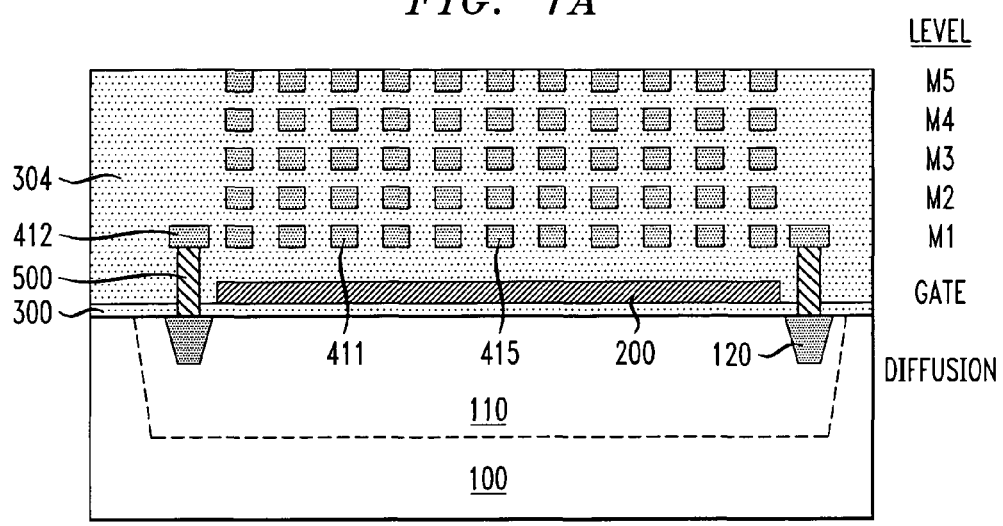
FIG. 1A shows a sectional view of an on-chip capacitive device consistent with an illustrative embodiment of the invention.
Figure 1B:
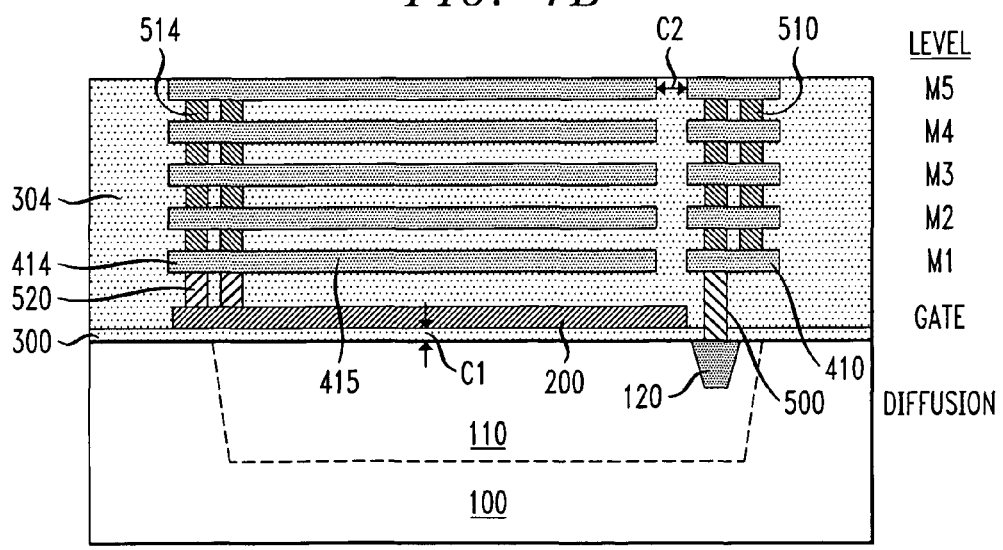
FIG. 1B shows another sectional view of the FIG. 1A capacitive device with the cutting plane perpendicular to that in FIG. 1A.
Figure 1C:
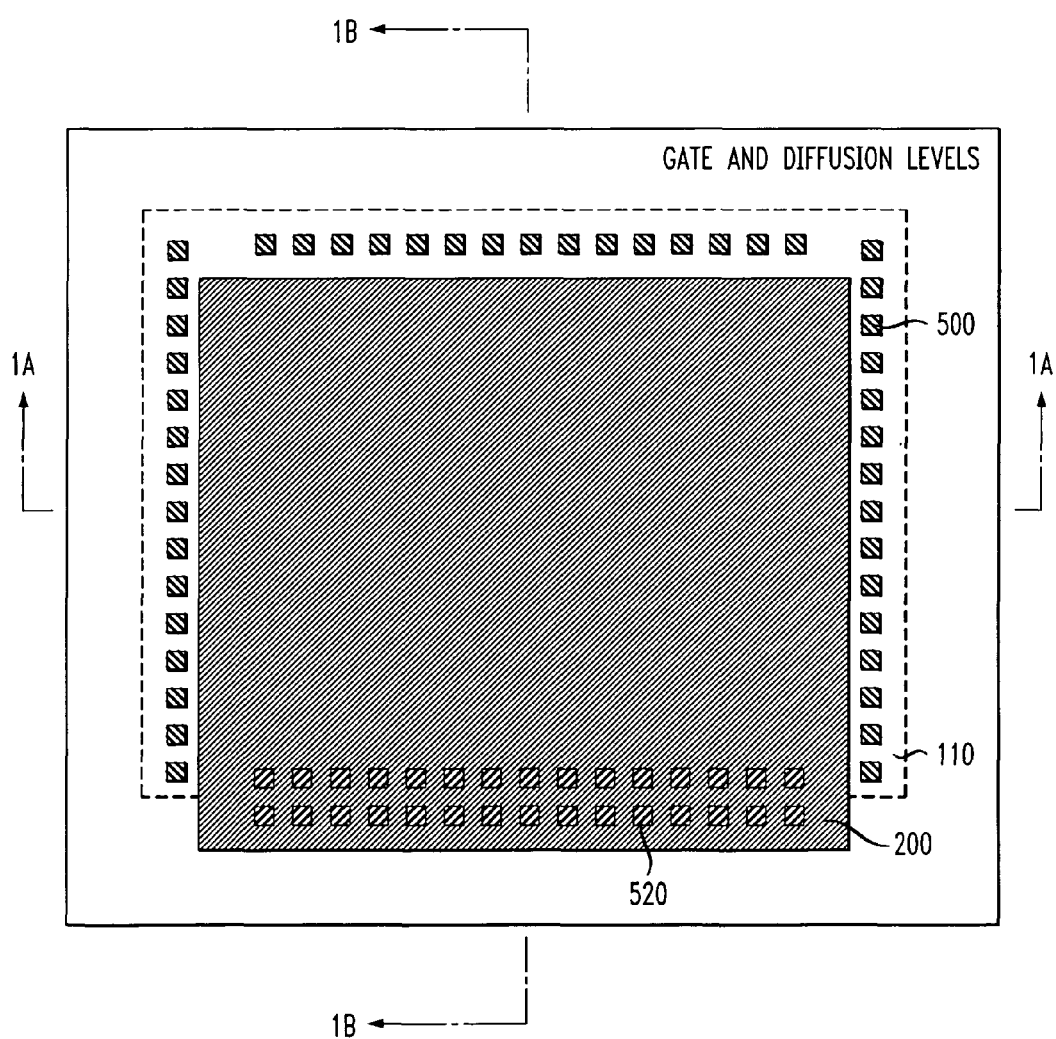
FIG. 1C shows the physical layout of the gate and diffusion levels of the FIG. 1A capacitive device.

The MOS capacitor of the illustrative embodiment is shown most clearly in FIGS. 1A-1C. The MOS capacitor comprises a substrate 100, a gate conductor 200, a dielectric 300, and a n-doped region 110 formed in the substrate. Moreover, the MOS capacitor further comprises highly n-doped source/drain regions 120 formed in those places where vertical contacts land.

The operation of the MOS capacitor will be apparent to one skilled in the art. In the illustrative embodiment, the application of a positive electrical bias to the gate 200 relative to the n-doped region 110 will induce positive charge on the gate. In response to the associated electric field, the n-doped region 110 supplies negatively-charged majority carriers (electrons) to the surface region of the substrate nearest the gate 200. In this "accumulation" regime, the capacitance versus bias characteristics will be relatively flat, and the MOS capacitor will act very much like a conventional parallel plate capacitor. Alternatively, a negative electrical bias can be applied the gate 200 relative to the n-doped region 110. In this situation, there are two regimes of capacitance behavior. In the "depletion" regime, negatively-charged majority carriers (electrons) in the n-doped region 110 move away from the surface region of the substrate nearest the gate 200 leaving positively-charged, immobile donor impurities to balance the negative charge on the gate. This has the effect of increasing the "effective" dielectric thickness and thereby decreasing the capacitance of the device. In the "inversion" regime, the value of the negative charge on the gate 200 is sufficiently large to induce a large number of positively-charged minority carriers (holes) to migrate to the surface region of the substrate nearest the gate. In this regime, the MOS capacitor again behaves like a parallel plate capacitor so long as the bias voltage is held constant or only modulated at low frequency.

Accordingly, high capacitance values can be achieved with the MOS capacitor in either the accumulation or inversion regimes.

Referring to FIG. 1C, it can be observed that both the gate 200 and the n-doped region 110 are patterned as single plates that occupy the majority of the area comprising the entire on-chip capacitive device. Such a shape is preferable because it will tend to maximize the total capacitance achieved by the MOS capacitor. However, it is to be appreciated that many other shapes are possible in accordance with this invention. For instance, the gate and diffusion levels can be patterned as a plurality of discrete lines or as combinations of lines and plates.

Now referring to FIGS. 1A and 1B, heavily doped source/drain regions 120 are preferably formed where vertical contacts land on the n-doped region 110. The vertical contacts are commonly filled with doped polysilicon, tungsten or aluminum. One skilled in the art will recognize that the heavily doped source/drain regions help to eliminate the unwanted non-ohmic current-voltage characteristics inherent in metal-to-semiconductor contacts. With sufficient doping of the source/drain regions, nearly ohmic contacts can be produced with near-linear current-voltage characteristics in both directions of current flow and with relatively low contact resistance. For instance, nearly ohmic contact behavior can be obtained between an aluminum contact and n-type silicon if the surface concentration of the dopant in the silicon is greater than about $10^{19}$ cm$^{-3}$.

The MOS capacitor is preferably formed using the same processing steps used to form other circuit structures in the remainder of the integrated circuit. The formation of the MOS capacitor, thereby, does not demand additional processing steps with their associated costs. For instance, the dielectric 300 is preferably formed at the same time a gate oxide layer or a sacrificial oxide layer is formed in the remainder of the integrated circuit. Likewise, the n-doped regions, the source/drain regions, and the gates would be formed when creating these same types of structures in other parts of the integrated circuit. Gates 200 may comprise polysilicon or other suitable gate materials. The dielectric 300 may comprise silicon dioxide or other suitable dielectrics.

Methods for forming such structures are commonly practiced in the semiconductor processing art and will be known to those skilled in this art. These processing steps include, but are not limited to: deposition, growth, etching, lithography, polishing, cleaning, stripping, annealing and ion implanting. These processing steps are described in detail in a number of publications, including S. Wolf and R. N. Tauber, *Silicon Processing for the VLSI Era, Volume 1* (1986), which is incorporated by reference.

Figure 1D:
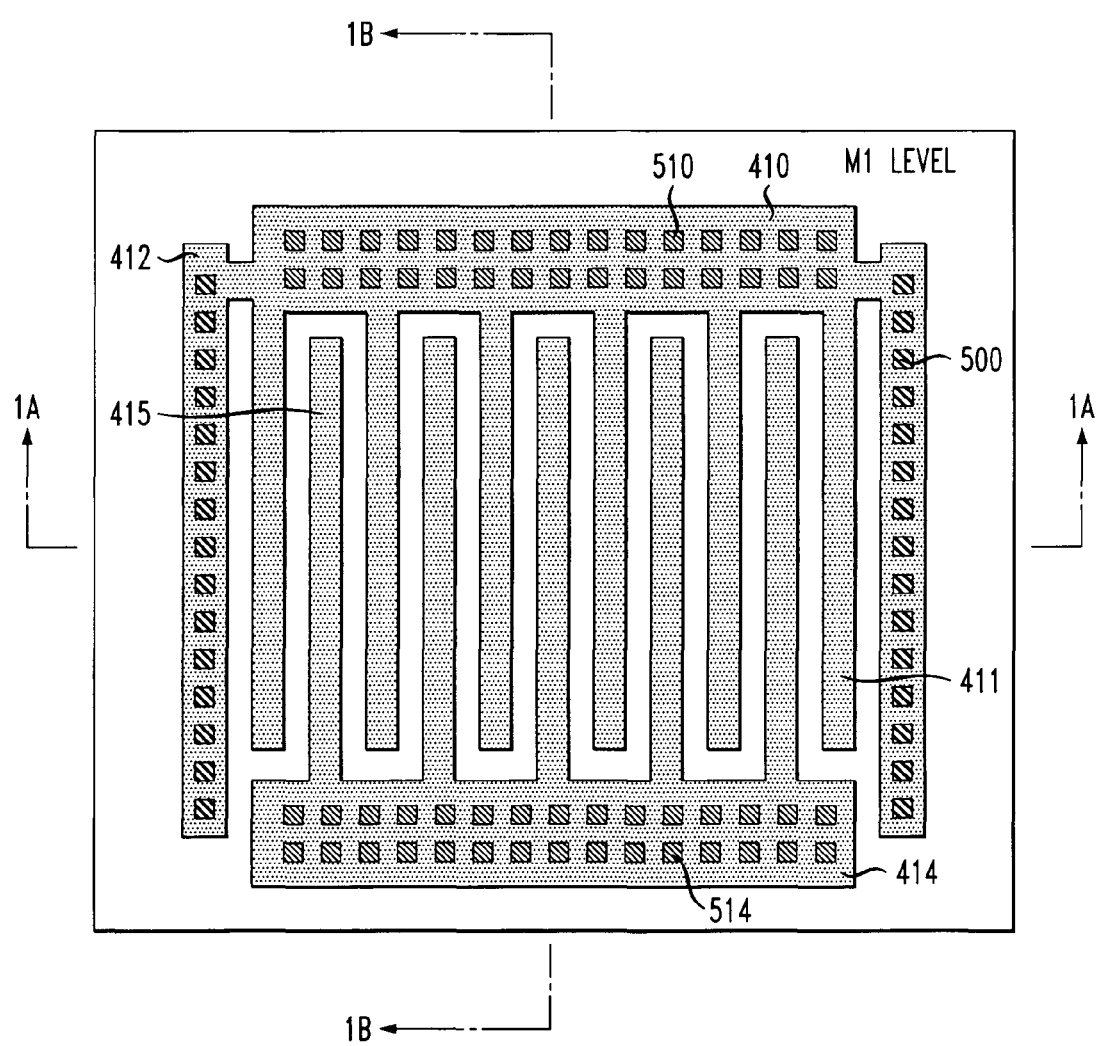
FIG. 1D shows the physical layout of the first metal level, "M1," of the FIG. 1A capacitive device.
Figure 1E:
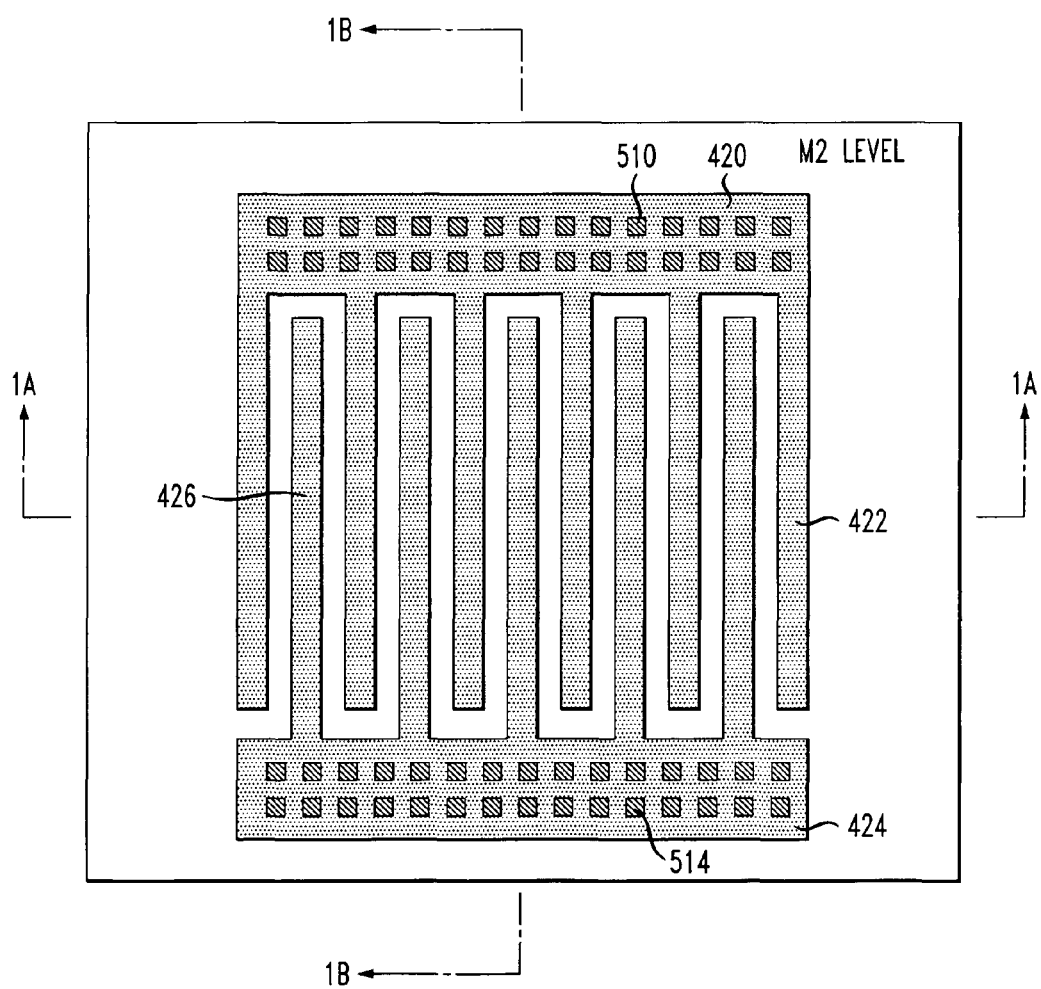
FIG. 1E shows the physical layout of the second metal level, "M2," of the FIG. 1A capacitive device.

The sub-elements of the illustrative embodiment's metal interconnect capacitor are also shown in FIGS. 1A-1E. The metal interconnect capacitor comprises five metal levels, labeled "M1" through "M5," respectively. The first metal level, M1, lies closest to the substrate. Each metal level contains two patterned metal features that are in close proximity to one another but are not in touching contact. Each patterned metal feature, in turn, comprises a plurality of metal fingers to create capacitive plates, and one or more contact busses to interconnect the fingers and allow interconnection with other levels. Referring to FIGS. 1D and 1E, M1 level comprises metal contact busses 410, 412 and 414, and metal fingers, represented collectively by 411 and 415. M2 level comprises metal contact busses 420 and 424, and metal fingers, represented collectively by 422 and 426. As shown in FIGS. 1A-1C, dielectric 304 fills the regions between the metal features and a plurality of metal contacts, represented collectively by vertical contacts 510 and 514, interconnects the various metal levels.

There are various methods by which the capacitance density of a metal interconnect capacitor can be increased. In the illustrative embodiment, the two patterned metal features comprising a given metal level are interdigitated. That is, each metal feature is shaped like a metal comb, wherein metal fingers extend from a larger bus that interconnects the various fingers. The fingers of the two metal features are placed such that they are interdigitated as shown in FIGS. 1D and 1E, and dielectric 304 fills the regions between the fingers.

The interdigitation of the metal features increases the effective area of the capacitive elements. Like in a simple parallel plate capacitor, the greater the effective area of the metal features, the greater the capacitance density of the device. While the interdigitation of comb features provides the preferable means of increasing this effective area, one should note that many alternative configurations could also be utilized and still come within the scope of this invention. For example, the metal features could be arranged in concentric rings.

A second method of increasing the capacitance density of the metal interconnect capacitor is by stacking metal levels vertically and then wiring each level such that the capacitance of each level is additive. One skilled in the art will recognize that the capacitance of two or more capacitors wired in parallel is the sum of the capacitance of each individual capacitor. Accordingly, a plurality of vertical contacts 510, 514 is utilized in the illustrative embodiment to electrically connect the metal features of the various metal levels so that the capacitive elements of each level act in parallel. In other words, the vertical contacts 510, 514 branch the electrical current going to the various metal features so that a portion of the current flows through each metal terminal.

Finally, increases in capacitance density can be achieved by spacing the metal features of the metal interconnect capacitor closer to one another and by use of a dielectric material with a higher dielectric constant. Typically, the process used to form the metal features will determine the maximum metal line width and minimum spacing between the lines. For instance, the minimum spacing between features is frequently limited by the capabilities of lithography and reactive ion etching. When this minimum spacing is violated, an electrical short may be formed between adjacent terminals and the device will not be functional. The use of an interlevel dielectric with a higher dielectric constant will also increase the capacitance density of the capacitive device, but, if used in the remainder of the integrated circuit, will also increase the unwanted parasitic capacitance of the metal interconnects outside the capacitive device. This will result in higher RC (resistance-capacitance) induced time delays for these interconnects that are usually unacceptable in higher performance integrated circuits. As a result, ideally, a dielectric with a higher dielectric constant could be used in the capacitive device while a dielectric with a lower dielectric constant could be used as the interlevel dielectric in the remainder of the integrated circuit. While possible, such concurrent use would require significant additional processing, including the use of additional lithographic masks.

Referring to FIGS. 1B, 1D and 1E, one will note that numerous vertical contacts 510, 514 are utilized to electrically connect one metal level to another metal level. Preferably, as in the illustrative embodiment, numerous vertical contacts connect the various levels so as to reduce the total contact resistance between the metal levels. One skilled in the art will recognize that this has the advantage of avoiding any issues associated with RC induced time delays. Moreover, using more than one contact between any two metal levels reduces the chances that a single defective contact will significantly impact the functionality of the total capacitive device.

While the illustrative embodiment is composed of five metal layers, it should be recognized that any number of metal levels greater than or equal to one would fall under the scope of the present invention. Advantageously, the components of the metal interconnect capacitor in the present invention are capable of being formed using the same processing steps utilized for creating the metal interconnect features for the remainder of the integrated circuit. Like the MOS capacitor, these processing steps are commonly practiced and will be known to those skilled in the art. These processing steps include, but are not limited to: deposition, growth, etching, lithography, polishing, cleaning, stripping and annealing. These processing steps are also described in, e.g., S. Wolf and R. N. Tauber, *Silicon Processing for the VLSI Era, Volume* 1 (1986).

The metal features and contacts used in the metal interconnect capacitor may comprise any known metal, including, but not limited to aluminum, tungsten or copper. Moreover, the dielectric 304 may comprise silicon dioxide or some other suitable dielectric.

In accordance with the invention, an increased capacitance density for the total on-chip capacitive device is achieved by wiring the MOS capacitor and the metal interconnect capacitor in parallel. Doing so, again, creates the situation wherein the capacitances of the two types of capacitors are additive. One method by which vertical contacts are used to interconnect the two types of capacitors in the illustrative embodiment is best shown in FIG. 1B. As mentioned earlier, a plurality of vertical contacts 510, 514 connects the metal features on each metal level to like features on other metal levels such that the levels of the metal interconnect capacitor are wired in parallel. Moreover, vertical contacts, represented collectively by vertical contact 520, electrically connect metal contact bus 414 of M1 to the gate 200. Finally, vertical contacts, represented collectively by vertical contact 500, electrically connect metal contact busses 410 and 412 of M1 to the n-doped region 110.

As discussed previously with respect to vertical contacts 510, 514, numerous vertical contacts are preferably utilized to connect the various M1 contact busses to the gate 200 and to the n-doped region 110. As before, the reason for using a plurality of contacts is to reduce total contact resistance and provide some redundancy for defective contacts. Of course, the particular number of contacts used may be varied in alternative embodiments.

Figure 2:
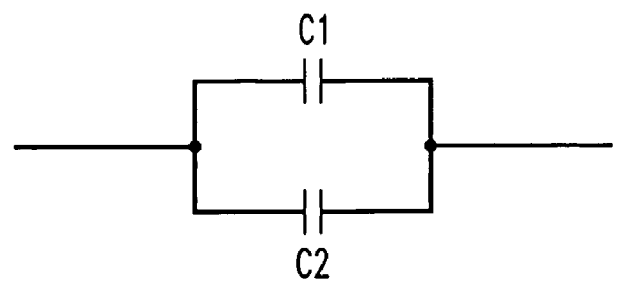
FIG. 2 shows an electrical schematic of an equivalent circuit of the FIG. 1A capacitive device.

FIG. 1B shows the capacitance achieved by the MOS capacitor, "$C_1$," and the capacitance achieved by the metal interconnect capacitor, collectively marked "$C_2$." FIG. 2 shows the equivalent circuit schematic of the illustrative embodiment. The equivalent circuit shows to C1 wired in parallel to C2.

The result is an on-chip capacitive device wherein the capacitance density is the sum of the capacitance densities of the MOS capacitor and the metal interconnect capacitor. When compared to a MOS capacitor alone, an approximately 7-50% gain in capacitance density will be achieved. This benefit can, advantageously, be accomplished without additional processing steps.

Figure 3:
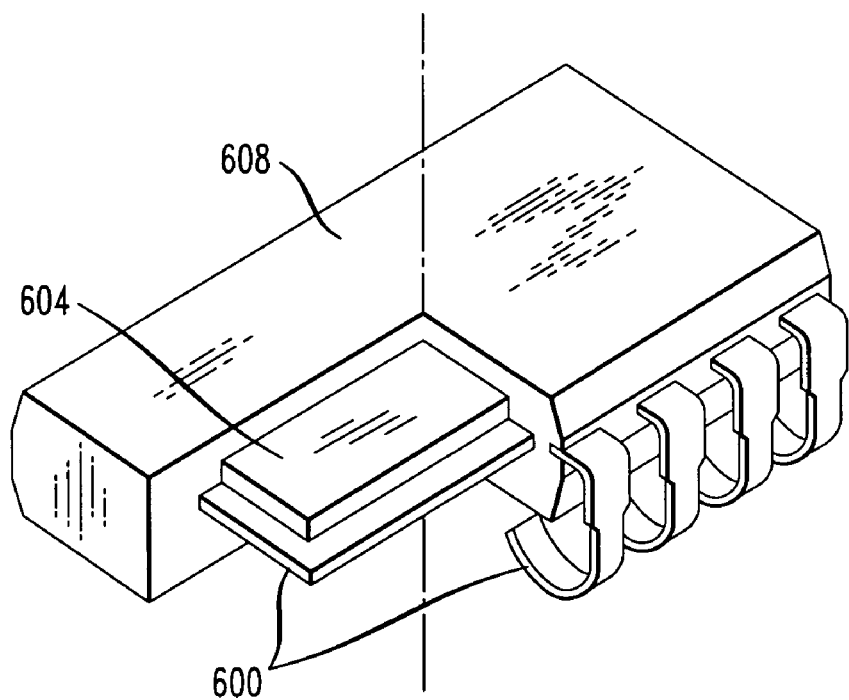
FIG. 3 shows a packaged integrated circuit consistent with FIG. 1A capacitive device.

In implementing an embodiment of the invention, a plurality of identical die are typically formed in a repeated manner on a surface of a wafer. Each die includes a device described herein, and may include other structures or circuits. The individual die are cut or diced from the wafer, then packaged as an integrated circuit. FIG. 3 shows an integrated circuit die consistent with this invention packaged in a typical plastic leadframe package. The packaged die comprises a leadframe 600, the die 604, and a plastic mold 608. One skilled in the art would know how to dice wafers and package die to produce integrated circuits. Integrated circuits so manufactured are considered part of this invention.

It should also be emphasized that the particular embodiments of the invention as described herein are intended to be illustrative only. For example, as previously noted, different device conductivity types can be used in the MOS capacitor. Also, the number and configuration of metal layers in the metal interconnect capacitor may be varied, as well as their manner of interconnection with each other and with the MOS capacitor. In addition, other embodiments of the invention may use significantly different structural arrangements of the various elements. These numerous other alternative embodiments within the scope of the following claims will be readily apparent to those skilled in the art.

What is claimed is:

1. An integrated circuit comprising:
   a semiconductor substrate;
   a MOS capacitor formed on the semiconductor substrate; and
   a metal interconnect capacitor formed at least in part in a region above the MOS capacitor;
   wherein the MOS capacitor and the metal interconnect capacitor are connected in parallel to form a single capacitive device; and
   wherein the metal interconnect capacitor comprises two or more patterned metal features separated by a dielectric, the two or more patterned metal features being within a single metal level of the integrated circuit.

2. The integrated circuit of claim 1 wherein the MOS capacitor comprises:
   one or more first terminals formed in the semiconductor substrate near the surface of the semiconductor substrate;
   a dielectric formed on top of the semiconductor substrate; and
   one or more second terminals formed on top of the dielectric, at least one second terminal overlapping at least one first terminal.

3. The integrated circuit of claim 1 wherein the MOS capacitor includes one or more first terminals comprising n-doped regions formed in the semiconductor substrate near the surface of the semiconductor substrate.

4. The integrated circuit of claim 1 wherein the MOS capacitor includes one or more first terminals comprising p-doped regions formed in the semiconductor substrate near the surface of the semiconductor substrate.

5. The integrated circuit of claim 1 wherein the MOS capacitor comprises a dielectric containing silicon dioxide formed on top of the semiconductor substrate.

6. The integrated circuit of claim 1 wherein the MOS capacitor comprises:
   a dielectric formed on top of the semiconductor substrate; and
   one or more second terminals comprising polysilicon formed on top of the dielectric.

7. The integrated circuit of claim 1 wherein the MOS capacitor is operative in an accumulation regime.

8. The integrated circuit of claim 1 wherein the MOS capacitor is operative in an inversion regime.

9. The integrated circuit of claim 1 wherein the two or more metal features are arranged so they are interdigitated.

10. The integrated circuit of claim 1 wherein the metal interconnect capacitor comprises:
    two or more metal levels, each metal level comprising two or more patterned metal features separated by a dielectric; and
    a plurality of vertical contacts that electrically connect patterned metal features in one metal level to patterned metal features in a different metal level.

11. The integrated circuit of claim 10 wherein the two or more patterned metal features on at least one metal level are arranged so they are interdigitated.

12. The integrated circuit of claim 1 further comprising a plurality of vertical contacts that electrically connect the MOS capacitor to the metal interconnect capacitor.

13. The integrated circuit of claim 12 wherein the MOS capacitor comprises:
    one or more first terminals formed in the semiconductor substrate near the surface of the semiconductor substrate; and
    a plurality of source/drain regions doped at a concentration greater than about $10^{18}$ cm$^{-3}$ formed in the one or more first terminals at those locations where vertical contacts land on a first terminal.

14. The integrated circuit of claim 13 wherein each source/drain region is doped with dopants of the same conductive type as the dopant used in the respective first terminal that the source/drain region occupies.

15. A method of forming an integrated circuit comprising:
    forming a MOS capacitor on a semiconductor substrate; and
    forming a metal interconnect capacitor at least in part in a region above the MOS capacitor;
    wherein the MOS capacitor and the metal interconnect capacitor are connected in parallel to form a single capacitive device; and
    wherein forming the metal interconnect capacitor comprises forming, within a single metal layer of the integrated circuit, two or more patterned metal features separated by a dielectric.

16. A method for forming an integrated circuit of claim 15 wherein forming the MOS capacitor does not require additional processing steps over the processing steps required to form the remainder of the integrated circuit.

17. A method for forming an integrated circuit of claim 15 wherein forming the metal interconnect capacitor does not require additional processing steps over the processing steps required to form the remainder of the integrated circuit.

18. An on-chip capacitive device comprising:
    a semiconductor substrate;
    a MOS capacitor formed on the semiconductor substrate; and
    a metal interconnect capacitor formed at least in part in a region above the MOS capacitor;
    wherein the MOS capacitor and the metal interconnect capacitor are connected in parallel; and
    wherein the metal interconnect capacitor comprises two or more patterned metal features separated by a dielectric, the two or more patterned metal features being within a single metal level of the device.

19. The method of claim 15, wherein forming the metal interconnect capacitor comprises:
    forming, within each of two or more metal levels, two or more patterned metal features separated by a dielectric; and
    forming a plurality of vertical contacts that electrically connect patterned metal features in one metal level to patterned metal features in a different metal level.

20. The device of claim 18 wherein the metal interconnect capacitor comprises:
    two or more metal levels, each metal level comprising two or more patterned metal features separated by a dielectric; and
    a plurality of vertical contacts that electrically connect patterned metal features in one metal level to patterned metal features in a different metal level.

* * * * *